US008012546B2

(12) United States Patent
Ishizuka et al.

(10) Patent No.: US 8,012,546 B2
(45) Date of Patent: Sep. 6, 2011

(54) METHOD AND APPARATUS FOR PRODUCING SEMICONDUCTOR FILMS AND RELATED DEVICES

(75) Inventors: Shogo Ishizuka, Tsukuba (JP); Shigeru Niki, Tsukuba (JP); Keiichiro Sakurai, Tsukuba (JP); Akimasa Yamada, Tsukuba (JP); Koji Matsubara, Tsukuba (JP)

(73) Assignee: National Institute of Advanced Industrial Science and Technology (JP)

( * ) Notice: Subject to any disclaimer, the term of this patent is extended or adjusted under 35 U.S.C. 154(b) by 886 days.

(21) Appl. No.: 11/843,936

(22) Filed: Aug. 23, 2007

(65) Prior Publication Data

US 2008/0072962 A1 Mar. 27, 2008

(30) Foreign Application Priority Data

Aug. 24, 2006 (JP) ................................. 2006-228342
Jun. 6, 2007 (JP) ................................. 2007-150108

(51) Int. Cl.
*H05H 1/24* (2006.01)
(52) U.S. Cl. ............ 427/569; 427/74; 427/76; 136/264; 422/186.29; 423/508; 423/509; 423/511
(58) Field of Classification Search .................. 427/569, 427/74, 76; 136/264; 422/186.29; 423/508, 423/509, 511
See application file for complete search history.

(56) References Cited

U.S. PATENT DOCUMENTS

| | | | |
|---|---|---|---|
| 4,798,660 A | 1/1989 | Ermer et al. | |
| 4,915,745 A | 4/1990 | Pollock et al. | |
| 5,045,409 A | 9/1991 | Eberspacher et al. | |
| 5,436,204 A | 7/1995 | Albin et al. | |
| 5,441,897 A | 8/1995 | Noufi et al. | |
| 5,804,054 A * | 9/1998 | Bhattacharya et al. | 205/239 |
| 6,310,281 B1 * | 10/2001 | Wendt et al. | 136/256 |
| 2003/0082834 A1 * | 5/2003 | Delahoy | 438/7 |
| 2003/0102023 A1 * | 6/2003 | Delahoy | 136/262 |
| 2004/0063320 A1 * | 4/2004 | Hollars | 438/689 |
| 2006/0173511 A1 * | 8/2006 | Greenberg et al. | 607/54 |
| 2008/0318034 A1 * | 12/2008 | Murakami et al. | 428/336 |

OTHER PUBLICATIONS

Hernandez-Rojas, J.L., et al., "Growth of chalcopyrite Cu(In,Ga)Se2/CuIn3Se5 absorbers by radio frequency . . . ". Journal of Vacuum Science & Technology A: Vacuum, Surfaces, and Films, vol. 13 Issue 3, May 1995, pp. 1083-1087. Abstract Only.*
Lakshmikumar, S.T., et al., "Plasma assisted two stage selenization process fo the preparation of selenide semiconductor thin films using elemental selenium vapor". J. Appl. Phys. 76 (5), Sep. 1, 1994 pp. 3068-3071.*
Tao, Yu, et al., "CuInSe2 Films Prepared by a Plasma-Assisted Selenization Process in Different Working Pressures". Chin. Phys. Lett. vol. 27, No. 2 (2010) 028101, pp. 1-3.*
*Thin Solid Films*, 403-404 (2002) 197-203, T. Negami, et. al., Elsevier Science B.V., PII: S0040-6090(01)01524-3.
*High Photocurrent Polycrystalline Thin-Film CdS/CuInSe₂ Solar Cell*, R.A. Mickelsen, et. al., *Applied Physics Letters*, 36 (1980) vol. 36, No. 5, Mar. 1980, pp. 371-373.

(Continued)

*Primary Examiner* — Bret Chen
(74) *Attorney, Agent, or Firm* — Ostrolenk Faber LLP (57) ABSTRACT

A method for producing a semiconductor film having a chalcopyrite structure including a Ib group element, a IIIb group element and a VIb group element including selenium, the method including cracking selenium with plasma to generate radical selenium, and using the radical selenium in the process of forming the semiconductor film.

4 Claims, 7 Drawing Sheets

OTHER PUBLICATIONS

*High Efficiency $CuIn_x Ga_{1-x}Se_2$ Solar Cells Made From $(In_x, Ga_{1-x})_2Se_3$ Precurson Films*, Andrew Gabor, et.al., *Applied Physics Letters*, 65 (2), Jul. 11, 1994, pp. 198-200.

*Solar Cells: Materials, Manufacture and Operation*, Tom Markvart, et. al., *Elsevier Science B.V.*, 2005, pp. 310-313.

\* cited by examiner

○ Se CONTRIBUTING TO FORMATION OF CIGS FILM ● Se NOT CONTRIBUTING TO FORMATION OF CIGS FILM

FIG. 3

○ Se CONTRIBUTING TO FORMATION OF CIGS FILM  ◉ Se NOT CONTRIBUTING TO FORMATION OF CIGS FILM

METHOD AND APPARATUS FOR PRODUCING SEMICONDUCTOR FILMS AND RELATED DEVICES

The present invention claims priority on Japanese Patent Application No. 2006-228342, filed Aug. 24, 2006, and Japanese Patent Application No. 2007-150108, filed Jun. 6, 2007, the contents of which are incorporated herein by reference.

BACKGROUND OF THE INVENTION

1. Field of the Invention

The present invention relates to a method and apparatus for producing a semiconductor film, photoelectric conversion devices and method for producing the devices. More particularly, the present invention is related to a method and apparatus for producing a semiconductor film having a chalcopyrite structure, photoelectric conversion devices and method for producing the devices.

2. Description of Related Art

A thin-film solar cell provided with a photovoltaic absorber layer including a semiconductor film having a chalcopyrite structure including a group Ib element, a group IIIb element and a group VIb element, which is represented by the formula: $CuInSe_2$, or such a semiconductor film having Ga and/or S intercrystallized, which is represented by the formula: $Cu(In_{1-x}Ga_x)(Se_yS_{1-y})_2$ ($0 \leq x \leq 1$, $0 < y \leq 1$), exhibits a high energy conversion efficiency. Therefore, such a thin-film solar cell is advantageous in that improvement of the conversion efficiency called light-soaking effects is achieved, and the thin-film solar cell exhibits an excellent resistance to aged deterioration. Generally, these types of thin films are referred to as CIS thin films or CIGS thin films, wherein the name represents the capital letters of the contained elements. Further, solar cells using such thin films are referred to as CIS solar cells or CIGS solar cells.

Figure 1:
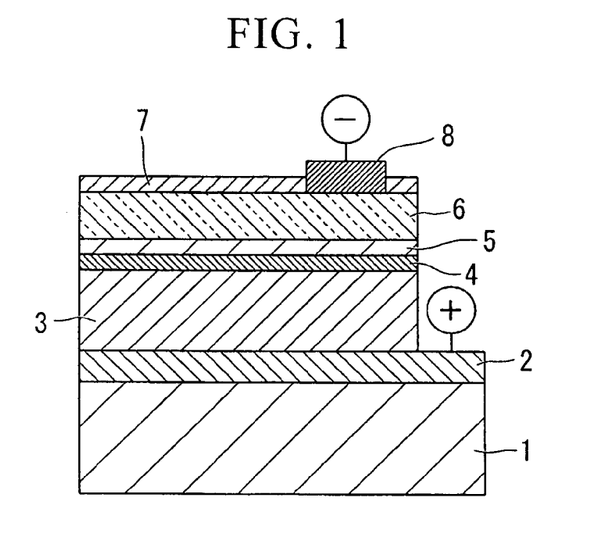
FIG. 1 is a diagram showing the basic structure of a CIGS solar cell.

FIG. 1 shows a typical structure of a CIGS solar cell. This solar cell has a basic structure in which a back electrode layer 2, a CIGS photovoltaic absorber layer 3, a buffer layer 4, a highly resistive zinc oxide layer 5, a transparent electrode layer 6 and an antireflection layer 7 are sequentially laminated on a substrate 1. Each of the back electrode layer 2 and the transparent electrode layer 6 has an electrode formed thereon for taking out the current obtained by photoelectric conversion. As the substrate 1, glass may be used, or alternatively, a metal foil or a polymer may be used. The back electrode 2 is typically Mo. As the buffer layer 4, an n-type semiconductor film is used. As the transparent electrode layer 6, an indium oxide film or a zinc oxide film is used.

As representative methods for producing CIGS films, the selenization method and the multi-source evaporation method are known.

The selenization method is a method in which a metal precursor such as Cu or indium is heat-treated in a selenium gas prior to lamination, followed by forming a CIGS thin film. Specific examples of the selenization method include methods disclosed in U.S. Pat. Nos. 4,798,660, 4,915,745 and 5,045,409. Although the selenization method is known as a technique for manufacturing CIGS solar cells with a large area, it has problems in that a high conversion efficiency cannot be obtained.

Figure 2:
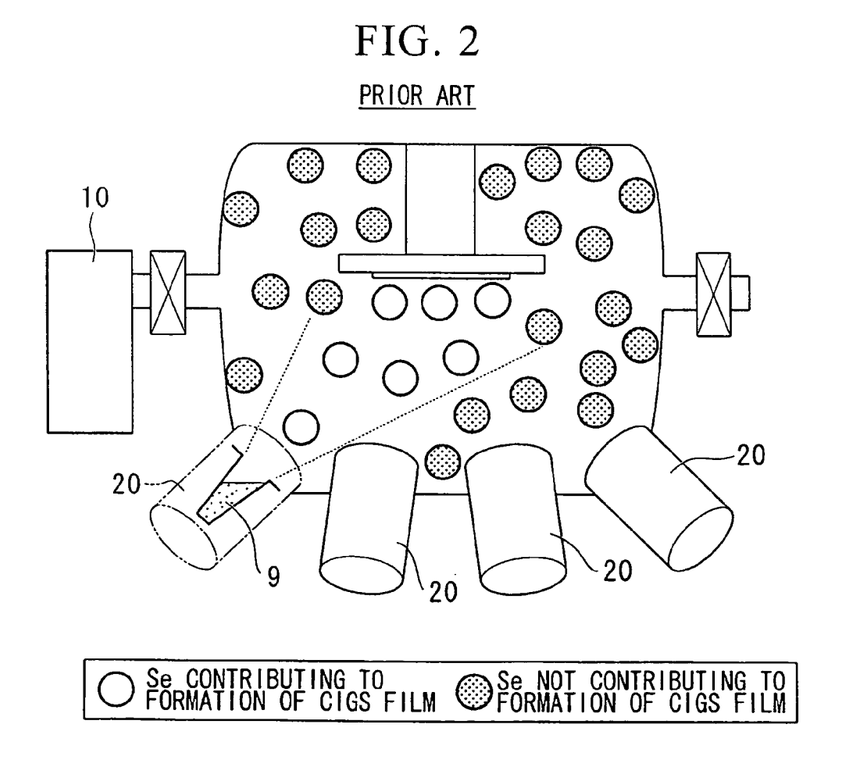
FIG. 2 is a schematic diagram showing the production of a CIGS thin film using Se vapor generated by a conventional crucible heating.

On the other hand, as shown in FIG. 2, in the multi-source evaporation method, each of the raw materials are heated to a predetermined temperature to control the amount of evaporation, and a film is formed on a substrate (for example, see Thin Solid Films 403-404 (2002) p. 197-203, and U.S. Pat. Nos. 5,436,204 and 5,441,897). The multi-source evaporation method is advantageous in that a high conversion efficiency can be obtained by a laboratory-scale CIGS solar cell having a small area. However, in the multi-source evaporation method, with respect to the selenium vapor generated by heating of the source selenium (Se), the vapor pressure thereof has to be made several ten times larger than that of the source metals such as Cu, In and Ga. The reasons for this is as follows. In the multi-source evaporation method, an ordinary selenium vapor includes relatively large molecules such as $Se_2$, $Se_5$, $Se_6$, $Se_7$ and $Se_8$, and hence, the reactivity thereof is low. Further, in the multi-source evaporation method, it is necessary to produce a film at a high temperature, and hence, selenium is re-vaporized from the surface of the produced film. Therefore, the amount of selenium contributing to the actual production of a film is extremely small as compared to the amount of selenium supplied to the vapor source crucible, and most of the supplied selenium is adhered to the inner wall or the like of the deposition chamber, and not utilized. As a result, a problem arises in that the utilization efficiency of the source selenium is markedly low as compared to other source metals. Thus, in the multi-source evaporation method, it was necessary to supply source selenium in an amount several ten times larger than that of source metals such as Cu, In and Ga, and to frequently perform maintenance such as removing substances adhered to the inner wall of the deposition chamber. Hence, the multi-source evaporation method was unsuitable for mass production.

SUMMARY OF THE INVENTION

The present invention takes the above circumstances into consideration, with an object of providing a method for producing a semiconductor film having a chalcopyrite structure comprising a group Ib element, a group IIIb element and a group VIb element including Se and a method for producing a photoelectric conversion device, in which loss of the source selenium during the film production process of a semiconductor thin film such as a CIGS thin film and adhesion of selenium on the inner wall of the deposition chamber can be prevented or suppressed.

The above-mentioned problems can be solved by a method and apparatus for producing a semiconductor film, photoelectric conversion devices and method for producing the devices, as follows.

(1) A method for producing a semiconductor film having a chalcopyrite structure including a group Ib element, a group IIIb element and a group VIb element including selenium, the method including cracking selenium with plasma to generate radical selenium, and using the radical selenium in the process of forming the semiconductor film.

(2) The method according to item (1) above, wherein the semiconductor film has a chalcopyrite structure represented by general formula: $Cu(In_{1-x}Ga_x)(Se_yS_{1-y})_2$ ($0 \leq x \leq 1$, $0 < y \leq 1$).

(3) An apparatus for producing a semiconductor film having a chalcopyrite structure including a group Ib element, a group IIIb element and a group VIb element including selenium, the apparatus being provided with a selenium source including: a source selenium tank for storing selenium heat-melted by a heater; a conduit for introducing selenium vapor from the source selenium tank to a discharge chamber; a valve provided on the conduit; and the discharge chamber in which a plasma gas and RF power is introduced and selenium is cracked by plasma to generate radical selenium.

(4) The apparatus according to item (3) above, wherein the semiconductor film has a chalcopyrite structure represented by general formula: $Cu(In_{1-x}Ga_x)(Se_yS_{1-y})_2$ ($0 \leq x \leq 1$, $0 < y \leq 1$).

(5) A method for producing a photoelectric conversion device provided with a semiconductor film having a chalcopyrite structure including a group Ib element, a group IIIb element and a group VIb element including selenium, the method including cracking selenium with a plasma to generate radical selenium, and using the radical selenium in the process of forming the semiconductor film.

(6) The method according to item (5) above, wherein the semiconductor film has a chalcopyrite structure represented by general formula: $Cu(In_{1-x}Ga_x)(Se_yS_{1-y})_2$ ($0 \leq x \leq 1$, $0 < y \leq 1$).

(7) A photoelectric conversion device provided with a photovoltaic absorber layer including a semiconductor film having a chalcopyrite structure including a group Ib element, a group IIIb element and a group VIb element including selenium, the semiconductor film being produced by using radical selenium generated by cracking selenium with plasma.

(8) The photoelectric conversion device according to item (7) above, wherein the semiconductor film has a chalcopyrite structure represented by general formula: $Cu(In_{1-x}Ga_x)(Se_yS_{1-y})_2$ ($0 \leq x \leq 1$, $0 < y \leq 1$), and the semiconductor film is produced by using radical selenium generated by cracking selenium with a plasma.

REFERENCE NUMERALS

1. Substrate
2. Back electrode layer
3. CIGS photovoltaic absorber layer
4. Buffer layer
5. Highly resistive zinc oxide layer
6. Transparent electrode layer
7. Antireflection film layer
8. Grid electrode
9. Crucible for source Se
10. Vacuum pump
11. Source Se
12. Valve
13. Discharge chamber
14. Heater
15. Plasma gas
16. RF power
17. RF coil
18. Deposition chamber
19. Substrate
20. Vapor source

PREFERRED EMBODIMENTS OF THE INVENTION

Hereinbelow, various embodiments of the present invention will be described with reference to the attached drawings.

According to the present invention, differing from the conventional method in which selenium vapor is supplied by simply heating, a CIGS thin film is produced by using radical selenium (frequently referred to as "cracked Se" in the present specification) as the source Se which is generated by cracking selenium with plasma such as RF or DC.

As the plasma gas, Ar, as well as $H_2$, He, Kr, Xe, Rn, $N_2$, $O_2$, $H_2Se$, $H_2S$, or a mixed gas thereof can be used.

Figure 3:
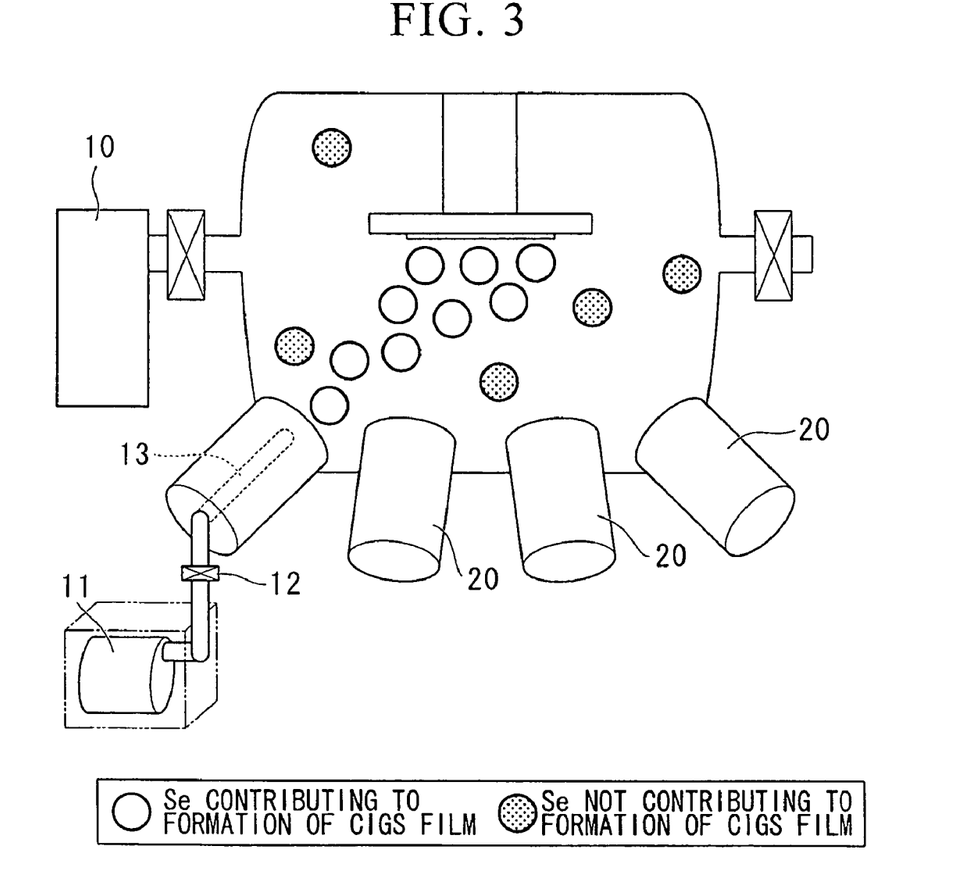
FIG. 3 is a schematic diagram showing the production of a CIGS thin film using cracked selenium defined in the present invention.

FIG. 3 is a schematic diagram showing the apparatus for producing a CIGS thin film according to the present invention.

The source selenium 11 within the source selenium tank is heat and melted by a heater (not shown) provided around the tank. The generated selenium vapor reaches the discharge chamber 13 via a conduit which is kept heated with the heater.

In the discharge chamber 13, a plasma gas and RF power is introduced, and the selenium vapor is cracked with plasma to generate radical selenium. Then, the cracked selenium reaches the substrate provided within the deposition chamber, and contributes to the formation of a CIGS thin film together with vapor of source metals such as Cu and In.

In the embodiment shown in FIG. 3, a group Ib element such as Cu and group IIIb elements such as In and Ga are heated by evaporation source 20 and supplied in the form of vapor. The evaporation source 20 is not particularly limited. For example, a conventional evaporation source using crucible heating may be used. Specific example of a conventional evaporation source using crucible heating include an evaporation source as described in R. A. Mickelsen and Wen S. Chen, Applied Physics Letters 36 (1980) p 371-373.

Figure 4:
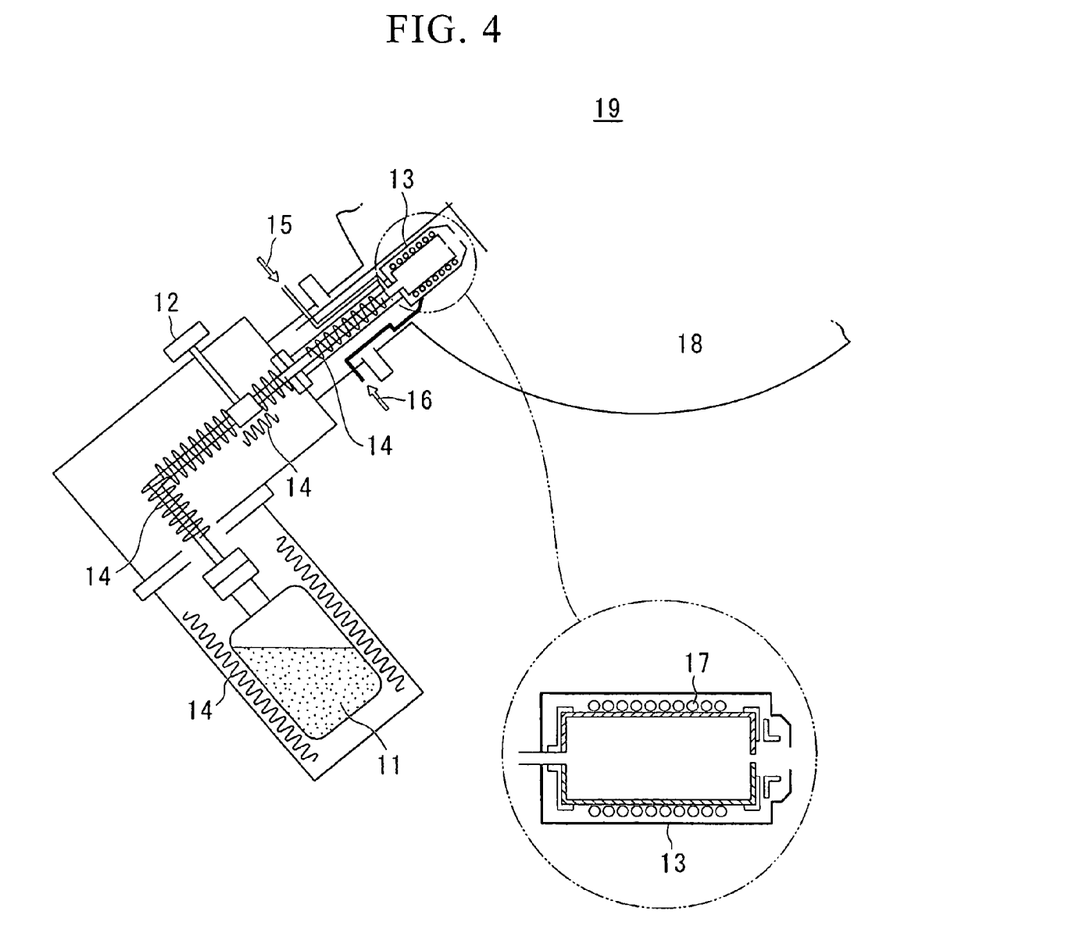
FIG. 4 is a detail drawing of the selenium source of a CIGS thin film production apparatus according to the present invention.

Next, the Se source of the apparatus for producing CIGS thin films according to the present invention is described in detail, with reference to FIG. 4.

In the Se source 11 shown in FIG. 4, selenium contained in the source Se tank is heated by the heater 14 to obtain selenium vapor. Then, the selenium vapor is introduced to the discharge chamber 13 via a conduit which is kept heated by the heater 14. The conduit is provided with a valve 12. Prior to film production, the valve 12 provided on the conduit is completely closed to seal the selenium vapor. As a result, loss of selenium can be prevented. During the film production, plasma gas 15 and RF power 16 is introduced to discharge electricity in the discharge chamber 13, and the valve 12 is adjusted to introduce the selenium vapor into the discharge chamber 13.

In this manner, the selenium vapor is subjected to cracking, and cracked selenium exhibiting high activity can be obtained. The cracked selenium is introduced into the deposition chamber 18 from the tip of the discharge chamber 13, and reaches the substrate 19 provided within the deposition chamber 18 to contribute to the formation of a CIGS thin film together with vapor of source metals such as Cu, In and Ga. Cracked selenium exhibits a high reaction efficiency as compared to selenium vapor, and hence, the consumption of the source selenium for film production can be significantly reduced. By virtue of such effects, source selenium can be greatly economized.

Next, explanation is given of the method for producing a CIGS thin film using the apparatus according to the present invention. In the production method according to the present invention, a conventional multi-source evaporation method can be used, except that radical selenium generated by plasma cracking is used as the source selenium. Examples include a method as described in R. A. Mickelsen and Wen S. Chen, Applied Physics Letters 36 (1980) p 371-373, and a method as described in Andrew M. Gabor, et al., Applied Physics Letters 65 (1994) p 198-200.

More specifically, in the "three-stage process" which is known as a multi-source evaporation method, a CIGS thin film is produced as follows. In the "first stage", group III elements such as In and Ga, and Se are irradiated onto a substrate heated to about 350° C. Subsequently, in the "second stage", the temperature of the substrate is elevated to about 550° C., and only Cu and Se are irradiated onto the substrate. In the second stage, when the Cu/group III element compositional ratio exceeds 1, a liquid-phase $Cu_2Se$ layer is formed on the surface of the thin film, and diffusion of In, Ga, Cu and Se irradiated in the first stage and/or the second stage is accelerated, and a CIGS thin film having a large grain diameter is formed. As the $Cu_2Se$ phase exhibits a high electroconductivity, when it remains on the surface of the thin film to be used for producing a solar cell device, it causes short-circuit. Therefore, in the "third stage", only In, Ga and Se are irradiated onto the substrate again, so as to form a Cu-poor thin film, and the film production is terminated. In this manner, a CIGS thin film is formed.

According to the present invention, differing from the conventional method using selenium vapor generated by crucible heating, supplying of selenium can be completely stopped when film production is not performed, thereby preventing loss of source selenium. Further, cracked selenium is in the form of small molecules and exhibits a high reaction efficiency as compared to selenium vapor, and hence, the consumption of the source selenium for film production can be significantly reduced. By virtue of such effects, source selenium can be greatly economized.

In addition, with respect to a CIGS thin film produced by the method of the present invention, the surface is flat and smooth as compared to a CIGS thin film produced by a conventional method. Therefore, suppression of short circuit in a device processing such as scribing and improvement in the quality of the transparent electrode layer formed on the CIGS in a CIGS solar cell can be expected.

In the present invention, a CIGS solar cell using a CIGS thin film produced by the method of the present invention can be produced by a conventional method. Specific example includes a method as described in Solar Cells: Materials, Manufacture and Operation' Edited by Tom Markvart and Luis Castaner, Elsevier, 2005, pp. 310-313.

EXAMPLES

As follows is a description of examples of the present invention, although the scope of the present invention is by no way limited by these examples.

Example 1

Using a vacuum deposition apparatus based on a molecular beam epitaxy apparatus having an effective film-production area of (10×10) cm and having a structure as shown in FIG. 3, CIGS thin films were produced under conditions wherein the distance between the Se source and the substrate was 30 cm, the film thickness was 1.8 μm, and the film-production rate was 0.7 μm/hr. The average consumption of source Se per one film production process was measured, and was found to be 5.08 g.

Figure 5A:
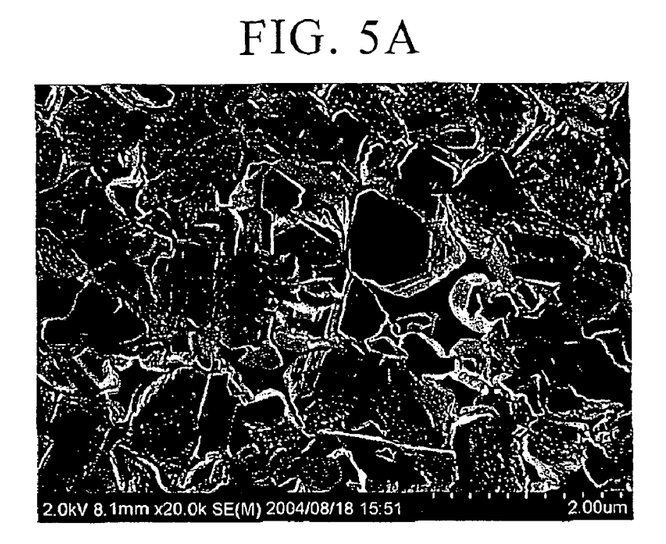
FIG. 5A is an electron micrograph of the surface of the CIGS thin film produced by using cracked selenium defined in the present invention.

The electron micrograph of the surface of the CIGS thin film produced is shown in FIG. 5A.

Comparative Example 1

CIGS thin film were produced and the average consumption of source Se per one film production process was measured in substantially the same manner as in Example 1, except that a conventional vapor source using crucible heating was used for the source Se. As a result, it was found that the average consumption of source Se was 59.5 g.

Figure 5B:
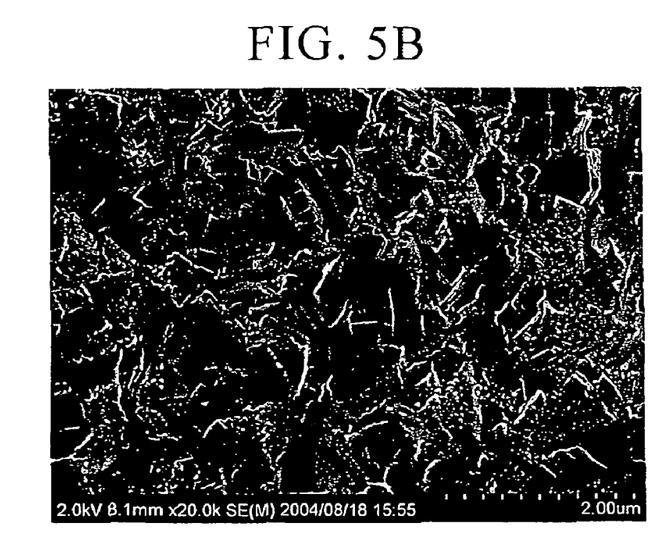
FIG. 5B is an electron micrograph of the surface of the CIGS thin film produced by using Se vapor generated by a conventional crucible heating.

The electron micrograph of the surface of the CIGS thin film produced is shown in FIG. 5B.

From the results of Example 1 and Comparative Example 1, it was found that the average consumption of source Se per one film production process of a CIGS thin film according to the present invention was significantly reduced to one tenth of the average consumption in the conventional method.

Further, from a comparison of FIG. 5A and FIG. 5B, it can be seen that the CIGS thin film produced by using the apparatus of the present invention has large grain diameter as compared to a conventional CIGS thin film, and the surface is flat and smooth. Therefore, by the CIGS thin film produced by using the apparatus of the present invention, suppression of short circuit in a device processing such as scribing and improvement in the quality of the transparent electrode layer formed on the CIGS can be expected.

Example 2

Using a thin film according to the present invention, a CIGS solar cell having substantially the same structure as shown in FIG. 1 except for the antireflection film 7 was produced as follows.

A Mo back electrode was formed on a glass substrate having a size of 3 cm×3 cm by a sputtering method. Then, a CIGS thin film was formed in the same manner as in Example 1, and a CdS buffer layer was formed by a chemical bath deposition (CBD) method. Thereafter, a highly resistive zinc oxide layer and a transparent electrode layer were formed by a sputtering method. Finally, an Al grid electrode was formed by evaporation. In this manner, eight independent solar cells were produced on a glass substrate. The area of one independent solar cell was about 0.5 $cm^2$.

Figure 6:
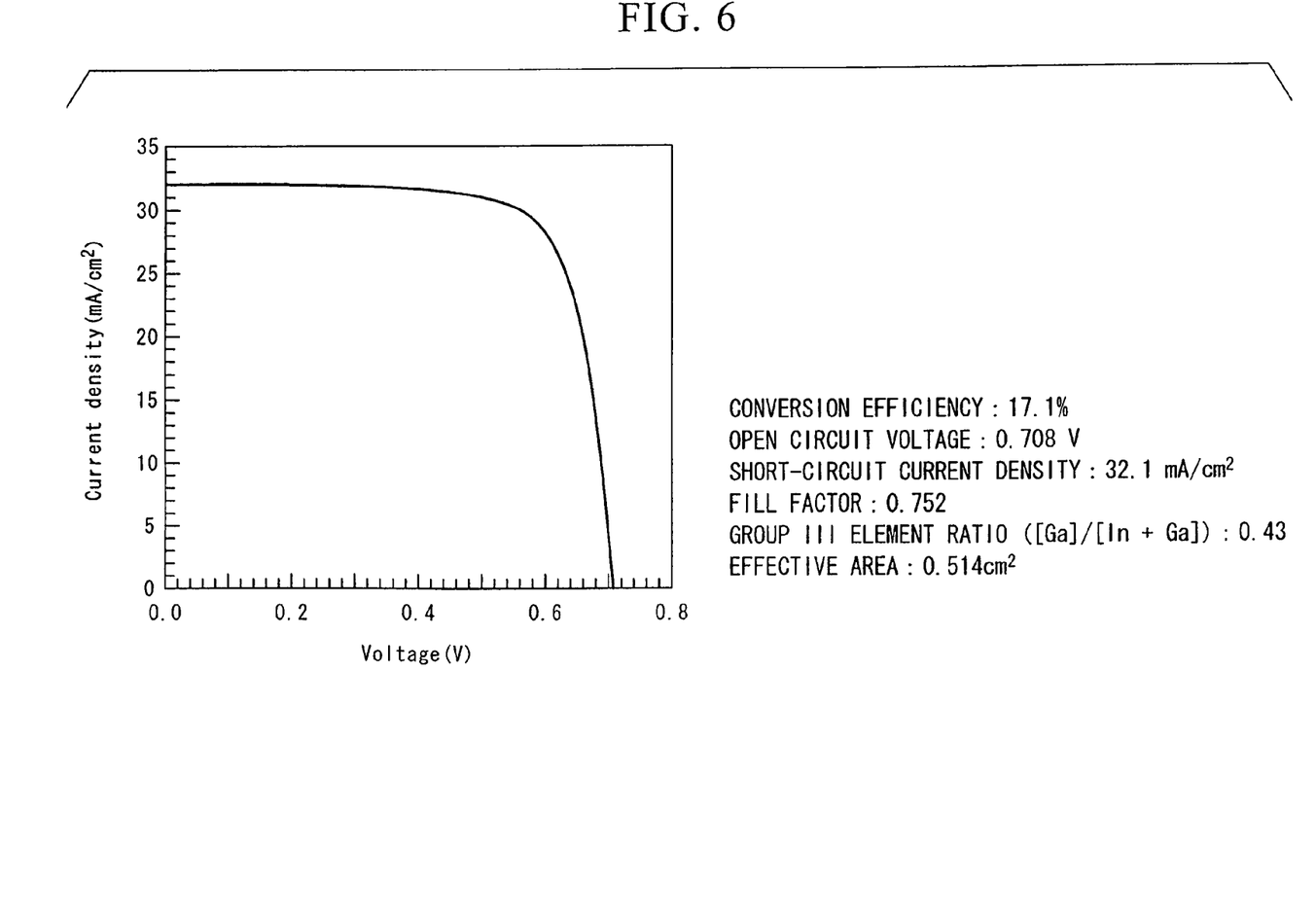
FIG. 6 is a graph showing the performance of a CIGS solar cell produced by the method of the present invention.

FIG. 6 is a graph showing the current-voltage characteristic curve of a CIGS solar cell produced by the method of the present invention, wherein AM was 1.5. Despite the fact that the produced solar cell had no antireflection film, it exhibited a conversion efficiency as high as 17% or more.

The performance of the CIGS solar cell was as follows.
Conversion efficiency: 17.1%
Open circuit voltage: 0.708 V
Short-circuit current density: 32.1 mA/cm$^2$
Fill factor: 0.752
Group III element ratio ([Ga]/[In +Ga]): 0.43
Effective area: 0.514 cm$^2$ From the performance of the CIGS solar cell as shown above, it can be seen that a device exhibiting a high performance and a high efficiency can be produced by the method as described above.

Figure 7A:
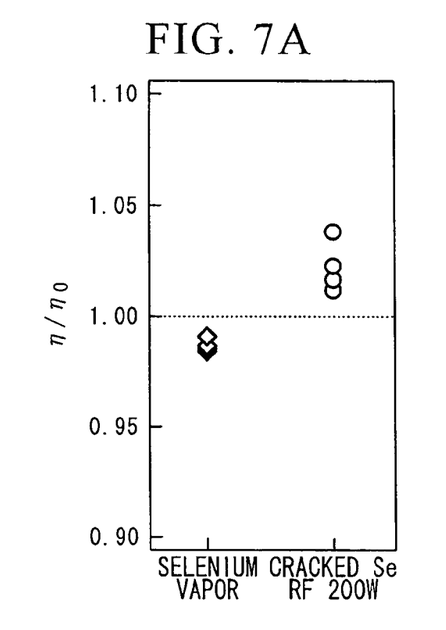
FIG. 7A is a diagram showing the change in property of the conversion efficiency by light irradiation.
Figure 7B:
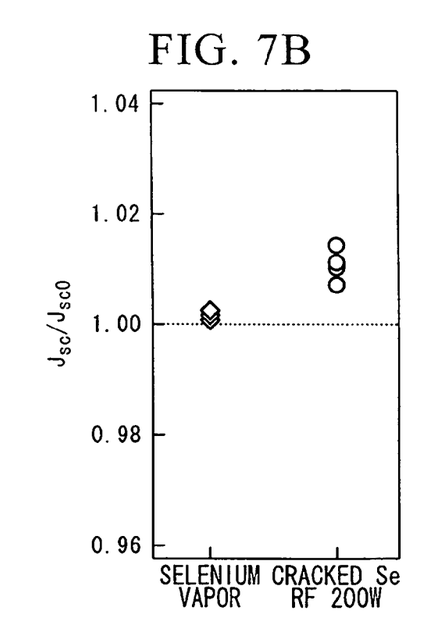
FIG. 7B is a diagram showing the change in property of the short-circuit current density by light irradiation.
Figure 7C:
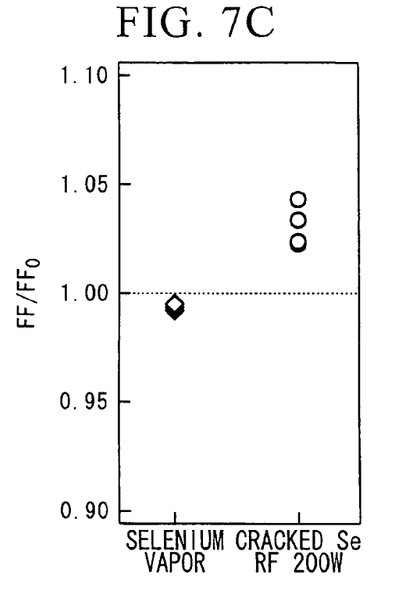
FIG. 7C is a diagram showing the change in property of the fill factor by light irradiation.

Further, with respect to the produced CIGS solar cell, the change in properties by light irradiation of the conversion efficiency, short-circuit current density and fill factor are shown in FIG. 7A, FIG. 7B and FIG. 7C, respectively. In FIG. 7A, FIG. 7B and FIG. 7C, $\eta_0$, $J_{sc0}$ and $FF_0$ respectively represent the conversion efficiency, short-circuit current density and fill factor following irradiation of light (100 mW/m$^2$ AM1.5G), and $\eta$, $J_{sc}$ and FF respectively represent the conversion efficiency, short-circuit current density and fill factor after 5 minutes from the light irradiation.

Figure 8:
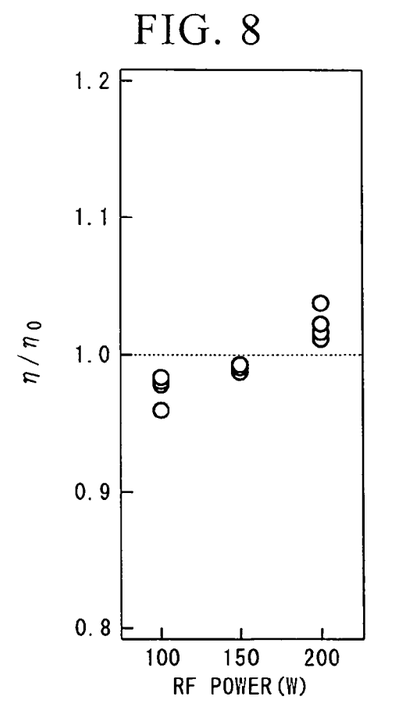
FIG. 8 is a diagram showing an example of controlling expression of light-soaking effects by RF cracking power.

Further, FIG. 8 is a diagram showing an example of controlling expression of light-soaking effects by RF cracking power. In FIG. 8, $\eta_0$ represents the conversion efficiency following irradiation of light (100 mW/m$^2$ AM1.5G), and $\eta$ represents the conversion efficiency after 5 minutes from the light irradiation.

Comparative Example 2

A CIGS solar cell was produced in substantially the same manner as in Example 2, except that a CIGS thin film was produced by using a conventional vapor source crucible heating as the Se source.

With respect to the produced CIGS solar cell, the change in properties by light irradiation of the conversion efficiency, short-circuit current density and fill factor are shown in FIG. 7A, FIG. 7B and FIG. 7C, respectively.

From the results shown in FIG. 7A, FIG. 7B and FIG. 7C, it was found that the performance of a CIGS solar cell produced by a conventional method was generally degraded by light irradiation, whereas the CIGS solar cell of Example 2 produced by the method of the present invention exhibits improved properties following light irradiation.

As a result, a phenomenon of improvement in the conversion efficiency can be seen. The reason for this is presumed that the lattice defect in the CIGS thin film can be controlled by RF cracking power which is a parameter for generation of radical Se.

The application of the CIGS thin film produced by the method as described above is not limited to solar cells, and the CIGS thin film can also be applied to other photoelectric conversion devices such as a photosensor and a photodiode.

INDUSTRIAL APPLICABILITY

According to the present invention, differing from the conventional method using selenium vapor generated by crucible heating, supplying of selenium can be completely stopped when film production is not performed, thereby preventing loss of source selenium. Further, cracked selenium is in the form of small molecules and exhibits a high reaction efficiency as compared to selenium vapor, and hence, the consumption of selenium for film production can be significantly reduced. By virtue of such effects, source selenium can be greatly economized. Therefore, the present invention is extremely useful in industry.

What is claimed is:

1. A method for producing a semiconductor film having a chalcopyrite structure comprising a group Ib element, a group IIIb element and a group VIb element including selenium,
    the method including cracking selenium with plasma in a first chamber to generate radical selenium, introducing the radical selenium into a second chamber, and subjecting the radical selenium, the group Ib element and the group IIIb element to codeposition in the second chamber.

2. The method according to claim 1, wherein said semiconductor film has a chalcopyrite structure represented by general formula: $Cu(In_{1-x}Ga_x)(Se_yS_{1-y})_2$ ($0 \leq x \leq 1$, $0 < y \leq 1$).

3. A method for producing a photoelectric conversion device provided with a semiconductor film having a chalcopyrite structure comprising a group Ib element, a group Mb element and a group VIb element including selenium,
    the method including cracking selenium with plasma in a first chamber to generate radical selenium, introducing the radical selenium into a second chamber, and subjecting the radical selenium, the group Ib element and the group IIIb element to codeposition in the second chamber 4. The method according to claim 3, wherein said semiconductor film has a chalcopyrite structure represented by general formula: $Cu(In_{1-x}Ga_x)(Se_yS_{1-y})_2$ $0 \leq y \leq 1$, $0 < y \leq 1$).

* * * * *